United States Patent
Huesken et al.

(10) Patent No.: US 9,577,080 B2
(45) Date of Patent: Feb. 21, 2017

(54) POWER SEMICONDUCTOR DEVICE

(71) Applicant: Infineon Technologies AG, Neubiberg (DE)

(72) Inventors: Holger Huesken, Munich (DE); Frank Dieter Pfirsch, Munich (DE); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/733,100

(22) Filed: Jun. 8, 2015

(65) Prior Publication Data
US 2015/0357449 A1    Dec. 10, 2015

(30) Foreign Application Priority Data
Jun. 9, 2014    (CN) .......................... 2014 2 0302039

(51) Int. Cl.
*H01L 29/739*    (2006.01)
*H01L 29/417*    (2006.01)
(Continued)

(52) U.S. Cl.
CPC ...... *H01L 29/7397* (2013.01); *H01L 29/0804* (2013.01); *H01L 29/0821* (2013.01); *H01L 29/0878* (2013.01); *H01L 29/41708* (2013.01); *H01L 29/7396* (2013.01); *H01L 29/0623* (2013.01); *H01L 29/407* (2013.01)

(58) Field of Classification Search
None
See application file for complete search history.

(56) References Cited

U.S. PATENT DOCUMENTS

2008/0150073 A1 * 6/2008 Willmeroth ......... H01L 29/0634
                                                            257/492
2012/0104555 A1    5/2012 Bobde et al.
(Continued)

FOREIGN PATENT DOCUMENTS

DE        10007415 C2    1/2002
JP        S63157477 A    6/1988
(Continued)

*Primary Examiner* — Calvin Choi
*Assistant Examiner* — Xiaoming Liu
(74) *Attorney, Agent, or Firm* — Murphy, Bilak & Homiller, PLLC (57) ABSTRACT

A power semiconductor device includes a semiconductor substrate layer of a first conductive type which has a lower part semiconductor layer of a second conductive type and an active region that includes a body region of the second conductive type, a source region of the first conductive type disposed in the body region, and a first doped region of the first conductive type at least a part of which is disposed below the body region. An emitter electrode is electrically connected to the source region, and a groove extends into the substrate layer and includes a shielding electrode electrically connected to the emitter electrode. The groove extends to a deeper depth into the substrate layer than the first doped region. At least a part of a gate is formed above at least a part of the source region and the body region, and is electrically insulated from the shielding electrode.

16 Claims, 3 Drawing Sheets

(51) Int. Cl.
*H01L 29/08* (2006.01)
*H01L 29/40* (2006.01)
*H01L 29/06* (2006.01)

(56) References Cited

U.S. PATENT DOCUMENTS

| | | | |
|---|---|---|---|
| 2012/0181550 A1* | 7/2012 | Fujibayashi | H01L 21/0475 257/77 |
| 2012/0261715 A1* | 10/2012 | Kim | H01L 29/1095 257/139 |
| 2014/0332845 A1* | 11/2014 | Bobde | H01L 29/7395 257/139 |

FOREIGN PATENT DOCUMENTS

| | | |
|---|---|---|
| JP | S64039774 A | 2/1989 |
| JP | H01117363 A | 5/1989 |
| JP | H07078978 A | 3/1995 |
| JP | H09326486 A | 12/1997 |

* cited by examiner

POWER SEMICONDUCTOR DEVICE

PRIORITY CLAIM

This application claims priority to Chinese Utility Model Application No. 201420302039.4 filed on 9 Jun. 2014, the content of the application incorporated herein by reference in its entirety.

TECHNICAL FIELD

The present application relates to a power semiconductor device, and in particular to an improved insulated gate bipolar transistor (IGBT).

BACKGROUND

Power semiconductor devices are widely used as electrical power conversion devices in consumer electronics, industrial machines, motor vehicles and high-speed trains, etc. By means of the improvements on the structure, the improvements of the performance are achieved year by year. Compared with a planar device, a power device using groove technology provides a channel width with an obvious increase per unit area. In addition, a semiconductor device using groove technology provides an excellent switch characteristic and is used in applications having requirements for fast switching.

In accordance with United States patent application US2012/0104555A1, an IGBT having a planar gate is described, wherein the IGBT exhibits a shielding electrode in a groove, which shielding electrode is isolated from a gate electrode and connected to a source terminal. Furthermore, this IGBT has an n-layer in the upper part of a drift region with a higher doping concentration than that of the drift region.

In addition, in accordance with German patent application DE10007415C2, a power device controlled by a metal oxide semiconductor (MOS) having a planar gate is described, wherein the power device also exhibits a shielding electrode in a groove, which shielding electrode is isolated from a gate electrode and connected to a source terminal.

However, the IGBT device of the prior art has a high voltage drop in a conducting state and a poor blocking capability. Therefore, there is a need for a device having a good blocking capability and having a low voltage drop in a conducting state of the device.

SUMMARY

One of the objects of the present application is to implement a device having a good blocking capability and having a low voltage drop in a conducting state of the device. According to one aspect of the present application, a device is proposed which has a shielding electrode and of which an additional n-doped layer is located below a p-body region, wherein the doping level of the additional n-doped layer is higher than that of a drift region and the vertical extension of the additional n-doped layer is relatively small.

The present application discloses a power semiconductor device, the power semiconductor device comprising: a semiconductor substrate layer of a first conductive type which has a lower part semiconductor layer of a second conductive type; and an active region comprising: a body region of the second conductive type; a source region of the first conductive type which is located in the body region; a first doped region of the first conductive type of which at least a part is located below the body region, wherein the first doped region has a non-uniform doping concentration, and a region of the first doped region with the highest doping concentration is located below the body region, and the highest doping concentration of the first doped region is at least higher than the doping concentration of the semiconductor substrate layer; an emitter electrode which is electrically connected to the source region; a groove which extends downwards into the substrate layer, comprising a shielding electrode electrically connected to the emitter electrode, wherein the groove extends to a deeper depth into the substrate layer than that of the first doped region; and a gate of which at least a part is formed above at least a part of the source region and the body region and is further electrically insulated from the shielding electrode.

In one embodiment, the doping concentration of the first doped region at least increases in a vertical direction from a surface between the body region and the first doped region towards a surface between the first doped region and the substrate layer.

In another embodiment, the doping concentration of the first doped region has a maximum value at a first depth below the body region.

In another embodiment, the first doped region is only located below the body region.

In another embodiment, the vertical extension of the first doped region is within a range between 500 nm and 5 µm.

In another embodiment, the vertical extension of the first doped region is within a range between 1 µm and 3 µm.

In another embodiment, the doping concentration of the first doped region has at least one lowest point at a second depth in the semiconductor device.

In another embodiment, the at least one lowest point of the doping concentration of the first conductive type has effective doping of the second conductive type.

In another embodiment, the at least one lowest point of the doping concentration of the first conductive type has an island form.

In another embodiment, the first doped region is interrupted in a transverse direction so as to form a plurality of strips with gaps, wherein the width and distance of the gap are constant or change in the transverse direction.

In another embodiment, at a location having a high curvature of a pn-junction formed between the body region and the first doped region, the first doped region is omitted or the doping concentration of the first doped region is relatively low.

In another embodiment, the power semiconductor device further comprises an additional doped region of the second conductive type, wherein the additional doped region is located in the first doped region or close to the first doped region.

In another embodiment, the power semiconductor device further comprises: a second doped region of the second conductive type which is located in the body region and is electrically connected to an emitter electrode.

In another embodiment, the power semiconductor device further comprises: a second doped region of the second conductive type which is located below the source region in the body region, wherein the doping concentration of the second doped region is higher than that of the body region.

In another embodiment, the semiconductor device is a vertical power device and comprises a collector which is located at the bottom of the semiconductor substrate, and the gate comprises at least one of a planar gate, a vertical gate and a combination thereof.

DESCRIPTION OF THE DRAWINGS

The accompanying drawings are included so as to provide a further understanding of the present application, and the accompanying drawings are incorporated in the specification and constitute a part thereof. The accompanying drawings show the embodiments of the present application and are used together with the description to explain the principle of the present application. Other embodiments of the present application and many expected advantages will be readily recognized, because, with reference to the detailed description below, they will become better understood. The elements of the accompanying drawings are not necessarily in proportion relative to each other. Similar reference numerals represent corresponding similar parts.

FIG. 1, which comprises FIGS. 1A, 1B and 1C, shows schematic sectional views of an IGBT according to one embodiment of the present application, wherein the maximum value of the doping of an n-type doped region is located below a body region, FIG. 1B is a sectional view of the IGBT of FIG. 1A along an arrowhead I, and FIG. 1C is a sectional view of the IGBT of FIG. 1A along an arrowhead II.

FIG. 2, which comprises FIGS. 2A, 2B and 2C, shows schematic sectional views of an IGBT according to one embodiment of the present application, wherein a well-shaped n-type doped region encompasses a body region, FIG. 2B is a sectional view of the IGBT of FIG. 2A along an arrowhead I, and FIG. 2C is a sectional view of the IGBT of FIG. 2A along an arrowhead II.

FIG. 3, which comprises FIGS. 3A, 3B and 3C, shows schematic sectional views of an IGBT according to one embodiment of the present application, wherein an n-type doped region is located below a p-type body region, FIG. 3B is a sectional view of the IGBT of FIG. 3A along an arrowhead I, and FIG. 3C is a sectional view of the IGBT of FIG. 3A along an arrowhead II.

FIG. 4, which comprises FIGS. 4A, 4B and 4C, shows schematic sectional views of an IGBT according to one embodiment of the present application, wherein an n-type doped region is located below a p-type body region and is adjacent to the p-type body region, FIG. 4B is a sectional view of the IGBT of FIG. 4A along an arrowhead I, and FIG. 4C is a sectional view of the IGBT of FIG. 4A along an arrowhead II.

FIG. 5, which comprises FIGS. 5A, 5B and 5C, shows schematic sectional views of an IGBT having an additional p-region with an enhanced blocking capability according to one embodiment of the present application, wherein FIG. 5B is a sectional view of the IGBT of FIG. 5A along an arrowhead I, and FIG. 5C is a sectional view of the IGBT of FIG. 5A along an arrowhead II.

DETAILED DESCRIPTION

In the detailed description below, reference is made to the accompanying drawings forming a part thereof, and in the accompanying drawings, specific embodiments in which the present application can be carried out are shown by means of illustration. It is to be understood that other embodiments may be utilized and structural or logical changes may be made without departing from the scope of the present application. By way of example, the features shown or described as a part of one embodiment can be used in combination with other embodiments so as to produce another embodiment. The present application is intended to comprise such modifications and variations. Examples are described with a specific language which should not be interpreted as limiting the scope of the accompanying claims. The accompanying drawings are not in proportion, but are only for illustrative purposes. For clarity, unless otherwise stated, the same reference numerals are used in different accompanying drawings to represent the same elements or manufacturing processes.

As used in the specification, the term "electrically coupled" is not limited to mean that elements must be directly coupled together. Alternatively, an intermediate element may be provided between elements which are "electrically coupled". As an example, some, all or none of the intermediate elements may be controllable so as to provide low-ohmic connections between the elements which are "electrically coupled" and to provide non-low-ohmic connections at another time. The term "electrically connected" is intended to describe a low-ohmic electrical connection between elements which are electrically connected together, for example, a connection through metals and/or highly doped semiconductors.

Some of the drawings refer to relative doping concentrations by indicating "−" or "+" beside the doping types. For example, "n$^-$" refers to a doping concentration which is less than that of an "n"-doped region, while an "n$^+$"-doped region has a larger doping concentration than that of the "n"-doped region. Doped regions having the same relative doping concentration may have or may not have the same absolute doping concentration. By way of example, two different n$^+$-doped regions may have different absolute doping concentrations. This also applies to, for example, an n$^-$-doped region and a p$^+$-doped region. In the embodiments described below, the conductive types of the illustrated semiconductor regions are represented as n-type or p-type, to be more detailed, one of n$^-$ type, n-type, n$^+$-type, p$^-$-type, p-type and p$^+$-type. In each of the illustrated embodiments, the conductive types of the illustrated semiconductor regions may be opposite. In other words, in an alternative embodiment of any one of the embodiments described below, the illustrated p-type regions may be of n-type, and the illustrated n-type regions may be of p-type.

The terms such as "first" and "second" and the like are used to describe various structures, elements, regions, sections, and the like, and are not intended to be limiting. Similar terms refer to similar elements throughout the entire description.

The terms "having", "containing", "including", "comprising" and the like are open and the terms indicate the presence of stated elements or features but do not preclude additional elements or features. The articles "a", "an" and "the" are intended to comprise plurals and singulars unless the context clearly dictates otherwise.

The term "substrate" or "semiconductor substrate" used in the following descriptions may comprise any semiconductor-based structure having a semiconductor surface. It is to be understood that these structures comprise silicon, silicon-on-insulator (SOI), silicon-on-sapphire (SOS), doped and undoped semiconductors, silicon epitaxial layers supported by a basic semiconductor base portion and other semiconductor structures. The semiconductors are not necessarily silicon-based. The semiconductors may also be silicon-germanium, germanium or gallium arsenide. According to the embodiments of the present application, silicon carbide (SiC) or gallium nitride (GaN) is typically a further example of the semiconductor substrate material.

An IGBT is taken as an example for detailed description of the present application below.

Figure 1:
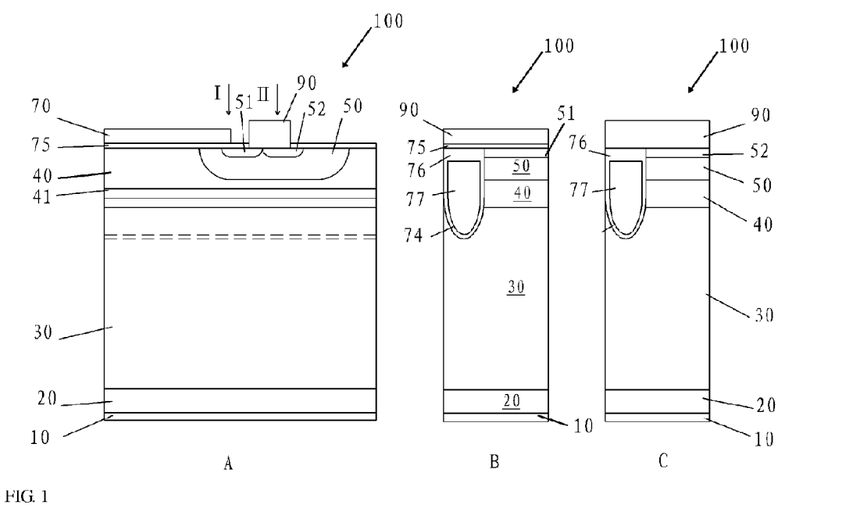

FIG. 1, which comprises FIGS. 1A, 1B and 1C, shows schematic sectional views of an IGBT 100 according to one embodiment of the present application, wherein the maximum value 41 of the doping of an n-type doped region 40 is located below a body region 50, FIG. 1B is a sectional view of the IGBT 100 of FIG. 1A along an arrowhead I, and FIG. 1C is a sectional view of the IGBT 100 of FIG. 1A along an arrowhead II.

As illustrated in FIG. 1A, provided is a semiconductor substrate layer 30 which may comprise but is not limited to silicon of a first conductive type, for example, an n-type. The semiconductor substrate layer 30 may comprise an epitaxial layer or a substrate layer. The semiconductor substrate layer 30 may have a lower part semiconductor layer 20 of a second conductive type, for example, a p-type. The lower part semiconductor layer 20 may also be a substrate layer or may be implanted in the semiconductor substrate layer 30. The body region may be formed in the substrate layer or on the substrate layer.

In the present example, the p-type lower part semiconductor layer 20 is the collector region of the IGBT device and the n$^-$-type substrate layer 30 is the drift region of the IGBT device. An n-type doped region 40 is arranged above the n$^-$-type drift region 30, and accordingly, a p-type body region 50 is arranged in the n-type doped region 40; in addition, an n$^+$-source region and an optional p$^+$-region 52 adjacent to the n$^+$-source region 51 are formed in the p-type body region 50. As shown in FIG. 1A, the IGBT is a vertical IGBT device, wherein a collector 10 is deposited on the bottom face of the device, i.e. on a collector region 20, and an emitter electrode 90 is deposited on the top face of the device, i.e. the n$^+$-source region 51, and the optional p$^+$-region 52. For example, the above-mentioned regions are formed by means of semiconductor processes such as photo-etching, etching, oxidization and injection. In addition, a gate electrode 70 is arranged on the top face of the device, wherein the gate electrode 70 is isolated from the p-type body region 50 and the n-type doped region 40 via an isolation layer 75, as illustrated in FIG. 1A.

With reference to FIG. 1B, a sectional view of the IGBT 100 of FIG. 1A along an arrowhead I is illustrated. As illustrated in FIG. 1B, for example, a groove 76 which extends from the top face into the drift region 30 is also arranged in a unit region of the IGBT 100, and a shielding electrode 77 which is isolated from the gate electrode 70 through an isolation layer 75 and is connected to the emitter electrode 90 (not illustrated in the drawing) is arranged in the groove 76, wherein two dotted lines in FIG. 1A respectively illustrate depth locations of the groove 76 and the shielding electrode 77 in the device. It should be pointed out that the groove 76 may be for example lined with a dielectric layer of for example oxides. The dielectric layer (also referred to as a groove insulation structure) insulates the shielding electrode 77 from the gate electrode 70 and insulates the shielding electrode 77 from the n-type doped region 40 and the n$^-$-type drift region 30. Furthermore, the isolation layer 75 extends horizontally and is located on the top of the device, and it isolates at least a part of the source region 51, the body region 50 and the n-type doped region 40 from the gate electrode 70. The isolation layer 75 for example may be an inter-layer dielectric layer (ILD). The groove insulation structure 74 for example may comprise field oxides.

FIG. 1C is a sectional view of the IGBT 100 of FIG. 1A along an arrowhead II. Except that the structures of the top are slightly different, FIG. 1C is substantially similar to FIG. 1B in structure. In particular, from top to bottom in FIG. 1C, there are respectively the emitter electrode 90, the optional p$^+$-region 52, the body region 50, the n-type doped region 40, etc.; and from top to bottom in FIG. 1B, there are respectively the gate electrode 70, the isolation layer 75, the n$^+$-source region 51, the n-type doped region 40, etc.

In addition, it should be pointed out that a region having the highest doping 41 in the n-type doped region 40 is preferably close to a pn-junction created by the n-type doped region 40 and the p-type body region 50 or under the pn-junction, as illustrated in FIG. 1A. In one embodiment, the doping concentration of this additional n-type doped region 40 decreases gradually as the depth below the region 41 having the highest doping increases. In another embodiment, the doping concentration of the doped region 40 at least increases in a vertical direction from a surface between the body region 50 and the doped region 40 towards a surface between the doped region and the substrate layer. For example, in one embodiment, the vertical extension of this additional n-type doped region 40 is preferably within a range between 500 nm and 5 µm and more preferably within a range between 1 µm and 3 µm. In one embodiment, the donor concentration of the region 41 having the highest doping is preferably within a range from 3 times to 50 times of the doping level of the n$^-$-type drift region 30, and more preferably within a range from 5 times to 20 times of the doping level of the n$^-$-type drift region 30.

Figure 3:
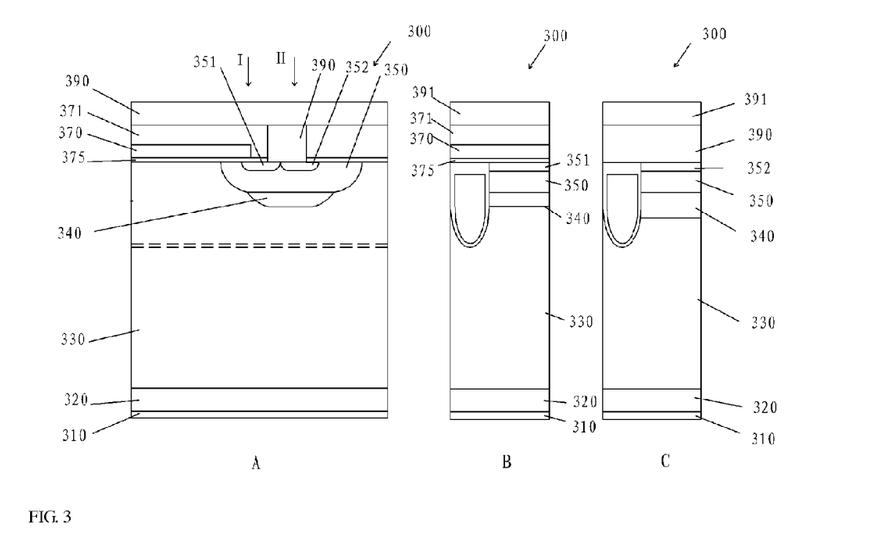

By using the device structure as illustrated in FIG. 1, a potential barrier for a hole to penetrate into the p-type body region 50 can be selected to be sufficiently high; meanwhile, on the other hand, the deterioration of a blocking voltage can be avoided or at least significantly reduced. This effect can be better in the device structure as illustrated in FIG. 3, as will be further described below.

In one embodiment, the emitter electrode 90 and the collector 10 may be constituted by main components, aluminum (Al), copper (Cu), or alloys of aluminum or copper (for example, AlSi, AlCu or AlSiCu) or contains main components, aluminum (Al), copper (Cu), or alloys of aluminum or copper (for example, AlSi, AlCu or AlSiCu). According to other embodiments, the emitter electrode 90 and the collector 10 may contain main components nickel (Ni), titanium (Ti), silver (Ag), gold (Au), platinum (Pt) and/or palladium (Pd). For example, the emitter electrode 90 and the collector 10 may comprise two or more sub-layers, wherein each of the sub-layers contains one or more of main components Ni, Ti, Ag, Au, Pt and Pd and/or alloys thereof. In one embodiment, the materials of the gate electrode 70 and the shielding electrode 77 may be highly-conductive materials, for example, doped semiconductor materials such as doped poly-crystalline silicon.

In one embodiment, the isolation layer 75 may comprise one or more sub-layers, for example, a binding layer, a buffer layer and/or a diffusion barrier layer. According to one embodiment, the isolation layer 75 comprises a thermally-grown silicon oxide layer. The isolation layer 75 may further comprise a diffusion barrier layer, for example, a silicon nitride layer or a silicon oxynitride layer. For example, thin silicon oxide provided from the deposited oxide using TEOS as a precursor material or, for example, silicate glass of undoped silicate glass may form the bonding or buffer layer. The isolation layer 75 may further comprise a main dielectric layer provided from BSG (boro-silicate glass), PSG (phospho-silicate glass) or BPSG (boro-phospho-silicate glass). Other embodiments may provide less or more sub-layers.

Figure 2:
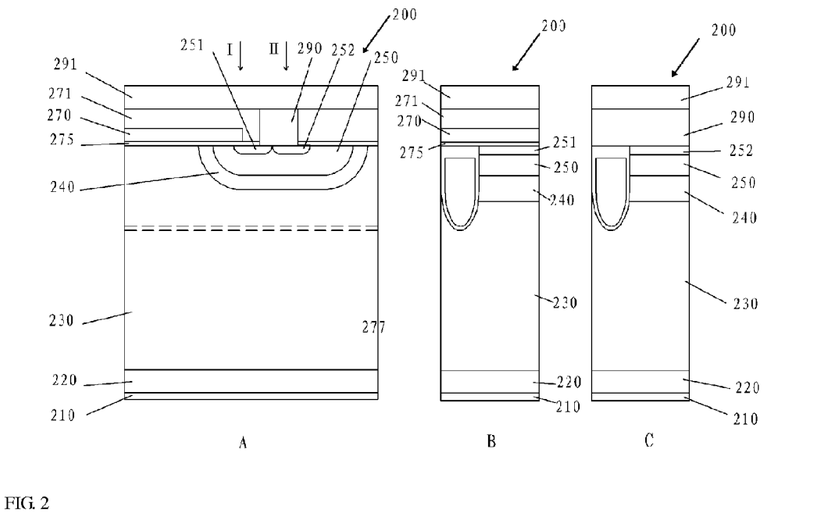

FIG. 2, which comprises FIGS. 2A, 2B and 2C, shows schematic sectional views of an IGBT 200 according to one embodiment of the present application, wherein a well-shaped n-type doped region 240 encompasses a p-type body region 250, FIG. 2B is a sectional view of the IGBT of FIG. 2A along an arrowhead I, and FIG. 2C is a sectional view of the IGBT of FIG. 2A along an arrowhead II. For brevity and clarity, descriptions of the parts corresponding to FIG. 1 are omitted herein.

The IGBT 200 of FIG. 2 differs from the IGBT 100 of FIG. 1 in that it further comprises a pad 291 connected to an emitter electrode 290, wherein the pad 291 is isolated from a gate electrode 270 via a passivation layer 271; and the n-type doped region 240 is well-shaped and encompasses the p-type body region 250. Again, the vertical extension of an n-type doped region 240 is relatively small, for example, far smaller than that of a groove 76 or a shielding electrode 77, as shown in FIG. 2A. In addition, the n-type doped region 240 is preferably uniform in thickness. Note that, in addition to the arrangement similar to that in FIG. 1, the optional p$^+$-region 252 may also be located below the source region 251 in the body region 250 (this case is not illustrated in FIG. 2A).

In one embodiment, the materials of the gate electrode 270 and the shielding electrode 277 may be highly-conductive materials, for example, doped semiconductor materials such as doped poly-crystalline silicon. The material of the isolation layer 275 may be or may contain silicon oxide, silicon nitride, silicon oxynitride or another insulation oxide or nitride. The material of the passivation layer 271 may be or may contain silicon oxide, silicon nitride, silicon oxynitride and/or another insulation oxide or nitride. The metallized contacts, for example, the emitter electrode 290 and the pad 291, may be of a structure of highly-doped poly-crystalline silicon, metals or metal compounds (for example, copper (Cu), aluminum (Al) and tungsten (W)) or highly-conductive compounds. According to other embodiments, the metallized contacts, for example, the emitter electrode 290 and the pad 291, may comprise two or more different material (for example, the metal silicide, the metal nitride, diffusion potential barrier materials and/or pure metals) layers.

In one embodiment, the passivation layer 271 may comprise one or more sub-layers, for example, a binding layer, a buffer layer and/or a diffusion barrier layer. According to one embodiment, the passivation layer 271 comprises a thermally grown silicon oxide layer. The passivation layer 271 may further comprise a diffusion barrier layer, for example, a silicon nitride layer or a silicon oxynitride layer. For example, thin silicon oxide provided from the deposited oxide using TEOS as a precursor material or, for example, silicate glass of undoped silicate glass may form the bonding or buffer layer. The passivation layer 271 may further comprise a main dielectric layer provided from BSG (boro-silicate glass), PSG (phospho-silicate glass) or BPSG (boro-phospho-silicate glass). Other embodiments may provide less or more sub-layers.

FIG. 3, which comprises FIGS. 3A, 3B and 3C, shows schematic sectional views of an IGBT 300 according to one embodiment of the present application, wherein an n-type doped region 340 is only located below a p-type body region 350, FIG. 3B is a sectional view of the IGBT of FIG. 3A along an arrowhead I, and FIG. 3C is a sectional view of the IGBT of FIG. 3A along an arrowhead II. For brevity and clarity, descriptions of the parts corresponding to FIG. 2 are omitted herein.

The IGBT 300 of FIG. 3 differs from the IGBT 200 of FIG. 2 in that an n-type doped region 340 is only located below the p-type body region 350 and the thickness of the n-type doped region 340 changes transversely, i.e. being non-uniform. For example, as illustrated in FIG. 3A, the n-type doped region 340 gradually becomes thinner at two ends. Furthermore, as illustrated in FIGS. 3B and 3C, the thickness of the n-type doped region 340 in FIG. 3B is less than that of the n-type doped region 340 in FIG. 3C, and this again shows that the thickness of the n-type doped region 340 changes.

In comparison with the structure disclosed in US2012/0104555A1, which incorporates a complete n-doped layer, the advantage of the embodiments of FIG. 3 lies in obtaining an electric advantage (i.e. the increase in the concentration of plasmas) without the defect of a high electric field for a given desired breakdown voltage, especially in an HV termination region.

According to one embodiment of the present application, the structure of the present application (i.e. an additional n-type doped region 340 located below a p-type body region 350) can be achieved by means of internal diffusion of donor atoms, and thus the implementation of these donor atoms can be achieved for example by means of ion injection, wherein the injection energy is higher than that for injecting p-type atoms so as to create the p-type body region 350. In addition or alternatively, a diffusion coefficient of these donor atoms can be higher than that of acceptor atoms for manufacturing the p-type body region 350. Alternatively, the injection energy is sufficient so that an end-of-range of the injected ions is located below a pn-junction between the p-type body region 350 and a region where a donor concentration increases, and thus no significant internal diffusion is necessary. For this purpose, for example, proton irradiation can be used, because for this method, a relatively low injection energy is sufficient. The temperature of an annealing step after this proton irradiation is preferably located in a range between 380° C. and 420° C.

According to one embodiment of the present application, this additional n-type doped region can for example be interrupted in the transverse direction so as to improve the blocking capability. One or more interruptions can be anticipated; for example, several small strips having gaps with clear boundaries can be anticipated. The width and distance of these gaps may be constant or may change in the transverse direction.

Figure 4:
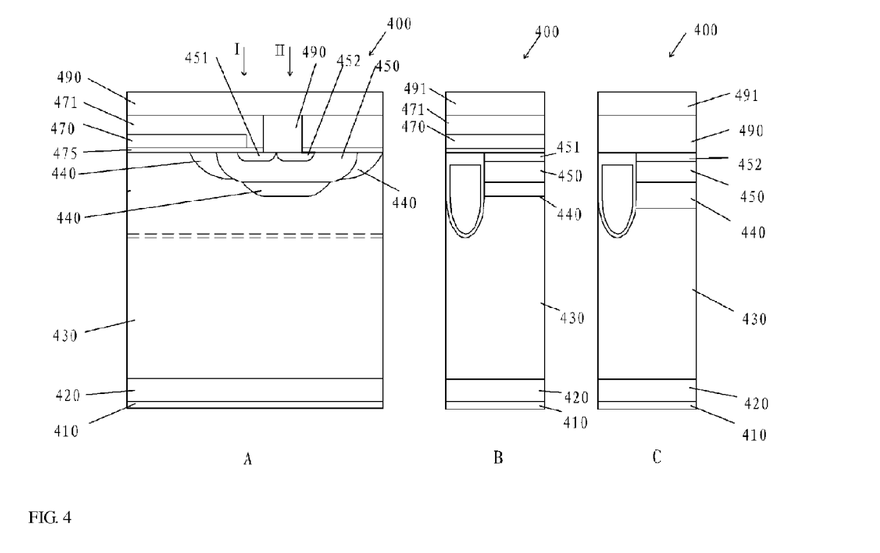

FIG. 4, which comprises FIGS. 4A, 4B and 4C, shows schematic sectional views of an IGBT 400 according to one embodiment of the present application, wherein at least one n-type doped region 440 is located below a p-type body region 450 and at least one n-type doped region 440 is adjacent to a side surface of the p-type body region 450, FIG. 4B is a sectional view of the IGBT 400 of FIG. 4A along an arrowhead I, and FIG. 4C is a sectional view of the IGBT 400 of FIG. 4A along an arrowhead II. For brevity and clarity, descriptions of the parts corresponding to FIG. 2 or 3 are omitted herein.

In a preferred embodiment, in a region in which the highest electric field strength occurs along a pn-junction between the p-type body region 450 and the additional n-type doped region 440, the additional n-type doped region 440 is omitted, or at least the additional n-type doped region 440 is manufactured with a lower donor dose. Typically, the region of the highest electric field strength is a region of a pn-junction having a high curvature. By means of this method, a relatively high additional n-type concentration below the p-type body region 450 and a relatively large increase in the concentration of free charge carriers below the p-type body region 450 in a region of the pn-junction parallel to the surface are achieved.

It is important to point out that there is a limit for this additional donor concentration, and, up to the limit, the blocking voltage will not be decreased, because the blocking voltage of the junction termination region is typically lower than that of the p-type body region; i.e. up to the limit, the decrease of $V_{ce\ sat}$ is possible without decreasing the blocking voltage.

Figure 5:
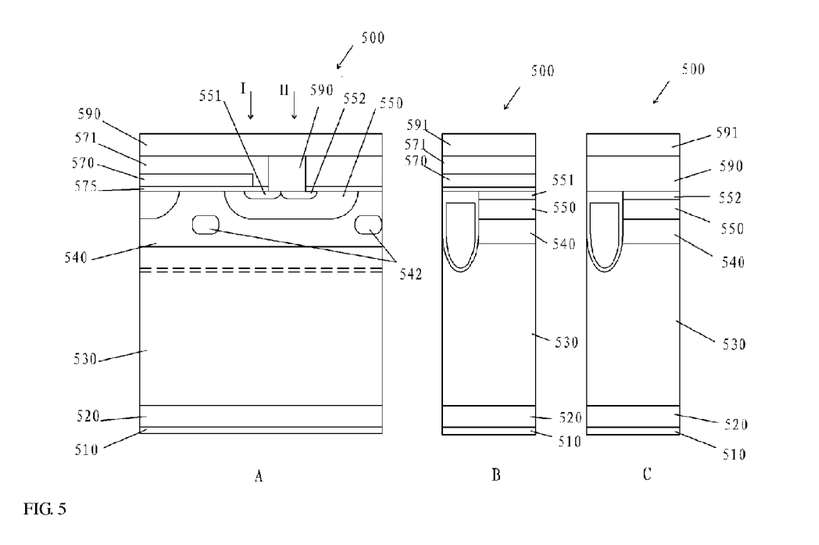

FIG. 5, which comprises FIGS. 5A, 5B and 5C, shows schematic sectional views of an IGBT 500 having an additional p-region 542 with an enhanced blocking capability according to one embodiment of the present application, wherein FIG. 5B is a sectional view of the IGBT of FIG. 5A along an arrowhead I, and FIG. 5C is a sectional view of the IGBT of FIG. 5A along an arrowhead II. For brevity and clarity, descriptions of the parts corresponding to FIG. 1 or 2 are omitted herein.

The IGBT 500 of FIG. 5 differs from the IGBT 100 of FIG. 1 or the IGBT 200 of FIG. 2 in that the additional p-type region 542 can be implemented in this additional n-type doped region 540 or close to this additional n-type doped region 540 so as to optimize the compensation for the enhanced n-type doping. In one or more embodiments, the number, shape and location of the additional p-type region 542 may change.

Although the present application is described with the embodiments of IGBT hereinabove, the present application can also be applied to other types of power devices, such as a MOSFET, and one difference lies in that the collector layer has the same conductive type as that of the drift layer.

Although, with reference to various drawings, typical shapes of various regions are strip-shaped, they can also be encompassing designs, or squares, rectangles, rings or the combination thereof.

It is to be understood that the features of various embodiments described here can be combined with one another, unless particularly otherwise indicated.

Although particular embodiments have been illustrated and described here, a person skilled in the art will understand that the illustrated and described particular embodiments can be replaced with various alternative and/or equivalent implementations without departing from the scope of the present application. This application is intended to cover any modifications or changes of the particular embodiments discussed here. Therefore, the present application is intended to be limited only by the claims and equivalents thereof.

What is claimed is:

1. A power semiconductor device, comprising:
    a semiconductor substrate layer of a first conductive type which has a lower part semiconductor layer of a second conductive type,
    an active region comprising:
        a body region of the second conductive type;
        a source region of the first conductive type disposed in the body region;
        a first doped region of the first conductive type—at least a part of which is disposed below the body region, the first doped region having a non-uniform doping concentration, and a region of the first doped region with the highest doping concentration being disposed below the body region, and the highest doping concentration of the first doped region being at least higher than the doping concentration of the semiconductor substrate layer;
    an emitter electrode electrically connected to the source region;
    a groove extending into the substrate layer and comprising a shielding electrode electrically connected to the emitter electrode, the groove extending to a deeper depth into the substrate layer than the first doped region; and
    a gate at least a part of which is formed above at least a part of the source region and the body region and is electrically insulated from the shielding electrode,
    wherein the semiconductor substrate layer of the first conductive type forms a drift region of the power semiconductor device, and
    wherein, in a vertical cross section of the power semiconductor device that extends through the body region and the first doped region, the drift region extends from the first doped region to the lower part semiconductor layer of the second conductive type.

2. The power semiconductor device of 1, wherein the doping concentration of the first doped region at least increases in a vertical direction from a surface between the body region and the first doped region towards a surface between the first doped region and the substrate layer.

3. The power semiconductor device of claim 2, wherein the doping concentration of the first doped region has a maximum value at a first depth below the body region.

4. The power semiconductor device of claim 1, wherein an entire upper boundary of the first doped region only directly adjoins with the body region, and wherein the first doped region is narrower than the body region.

5. The power semiconductor device of claim 1, wherein a vertical extension of the first doped region is within a range between 500 nm and 5 μm.

6. The power semiconductor device of claim 5, wherein the vertical extension of the first doped region is within a range between 1 μm and 3 μm.

7. The power semiconductor device of claim 1, wherein the doping concentration of the first doped region has at least one lowest point at a second depth in the power semiconductor device.

8. The power semiconductor device of claim 7, wherein the at least one lowest point of the doping concentration of the first conductive type has effective doping of the second conductive type.

9. The power semiconductor device of claim 7, wherein the at least one lowest point of the doping concentration of the first conductive type has an island form.

10. The power semiconductor device of claim 1, wherein the first doped region is interrupted in a transverse direction so as to form a plurality of strips with gaps, wherein a width and a distance of the gaps are constant or change in the transverse direction.

11. The power semiconductor device of claim 1, wherein, at a location having a high curvature of a pn-junction formed between the body region and the first doped region, the first doped region is omitted.

12. The power semiconductor device of claim 1, further comprising an additional doped region of the second conductive type disposed in the first doped region or close to the first doped region.

13. The power semiconductor device of claim 1, further comprising a second doped region of the second conductive type disposed in the body region and electrically connected to an emitter electrode.

14. The power semiconductor device of claim 1, further comprising a second doped region of the second conductive type disposed below the source region in the body region, wherein a doping concentration of the second doped region is higher than that of the body region.

15. The power semiconductor device of claim 1, wherein the power semiconductor device is a vertical power device and comprises a collector disposed at a bottom of the semiconductor substrate layer and in contact with the lower part semiconductor layer, and wherein the gate comprises at least one of a planar gate, a vertical gate and a combination of a planar gate and a vertical gate.

16. The power semiconductor device of 1, wherein the drift region of the power semiconductor device is a continuous region of the first conductive type having a doping concentration that is lower than the highest doping concentration of the first doped region.

\* \* \* \* \*

UNITED STATES PATENT AND TRADEMARK OFFICE
CERTIFICATE OF CORRECTION

PATENT NO. : 9,577,080 B2
APPLICATION NO. : 14/733100
DATED : February 21, 2017
INVENTOR(S) : H. Huesken et al.

It is certified that error appears in the above-identified patent and that said Letters Patent is hereby corrected as shown below:

Column 9, Line 57 (Claim 1, Line 9), please change "type—at" to -- type at --

Signed and Sealed this
Thirteenth Day of June, 2017

Joseph Matal
*Performing the Functions and Duties of the
Under Secretary of Commerce for Intellectual Property and
Director of the United States Patent and Trademark Office*